(12) United States Patent
Nagarajan et al.

(10) Patent No.: US 7,570,704 B2
(45) Date of Patent: Aug. 4, 2009

(54) TRANSMITTER ARCHITECTURE FOR HIGH-SPEED COMMUNICATIONS

(75) Inventors: Mahalingam Nagarajan, Grafton, MA (US); Eduard Roytman, Brookline, MA (US)

(73) Assignee: Intel Corporation, Santa Clara, CA (US)

( * ) Notice: Subject to any disclaimer, the term of this patent is extended or adjusted under 35 U.S.C. 154(b) by 654 days.

(21) Appl. No.: 11/290,860

(22) Filed: Nov. 30, 2005

(65) Prior Publication Data
US 2007/0121716 A1 May 31, 2007

(51) Int. Cl.
*H04L 27/00* (2006.01)
*G06F 17/10* (2006.01)

(52) U.S. Cl. .................................. 375/295; 708/323

(58) Field of Classification Search ............... 375/229, 375/257, 295–296; 341/144; 708/300, 322–323, 708/523; 323/315
See application file for complete search history.

(56) References Cited

U.S. PATENT DOCUMENTS

| 5,241,492 | A | * | 8/1993 | Girardeau, Jr. ............... 709/523 |
| 5,254,883 | A |   | 10/1993 | Horowitz et al. |
| 5,941,940 | A | * | 8/1999 | Prasad et al. ................. 708/523 |
| 6,049,531 | A | * | 4/2000 | Roy ........................ 370/395.53 |
| 6,427,159 | B1 | * | 7/2002 | Giaume ....................... 708/523 |
| 6,507,225 | B2 |   | 1/2003 | Martin et al. |
| 6,774,678 | B2 |   | 8/2004 | Martin et al. |
| 2001/0026595 | A1 | * | 10/2001 | Dally ......................... 375/296 |
| 2003/0235253 | A1 | * | 12/2003 | Dally ......................... 375/259 |
| 2005/0174099 | A1 | * | 8/2005 | Ohkubo et al. ............... 323/315 |

OTHER PUBLICATIONS

A Serial Link Transceiver Based on 8 Gsa/s A/D and D/A Converters in 0.25 μm CMOS, Jan. 31, 2001, William Ellersick, Chih-Kong Ken Yang, Vladimir Stojanovic, Siamak Modjtahedi, and Mark A. Horowitz.
Low-Power Equalizer Architectures For High-Speed Modems, Oct. 1998, Kamran Azadet and Chris J. Nicole Bell Laboratories, Lucent Technologies.
HDTV Data Carrier Separation Using A Multiplexer Filter, 1993, Maurice Caldwell, Sandip Parikh, Rod Angle, and Ken Kindsfater David Sarnoff Research Center, Princeton, New Jersey.

* cited by examiner

*Primary Examiner*—Khanh C Tran
(74) *Attorney, Agent, or Firm*—Carrie Boone; Carrie A. Boone, P.C.

(57) ABSTRACT

A transmitter architecture includes an equalizer and a D/A converter, for high-speed transmission of data across a channel. The equalizer includes a two-tap MAC as part of an N-stage, two-way interleaved FIR filter. The two-tap MAC provides substantial power and area savings over conventional MAC-based FIR filter designs, and may be implemented in short or long communications channels. The D/A converter is decoupled from the equalizer. Its N-bit, binary-weighted driver includes matched unit current generation cells, all of which are fully utilized during each digital-to-analog conversion. The D/A converter remains unchanged, even when the characteristics of the equalizer are changed.

21 Claims, 12 Drawing Sheets

TRANSMITTER ARCHITECTURE FOR HIGH-SPEED COMMUNICATIONS

FIELD OF THE INVENTION

The present invention relates generally to communication systems and, more particularly, to data transmission over a high-speed communications channel.

BACKGROUND OF THE INVENTION

The design of an input/output (I/O) transmission interface for transmitting data across a communications channel poses many challenges. The channel may be any medium through which the data may pass, including, but not limited to, a trace on a printed circuit board, a cable between two personal computers, or, in the case of wireless communications, the ambient air. Issues such as high insertion loss, near- and far-end cross-talk, inter-symbol interference (ISI), jitter amplification, tight requirements on transmit or receive pad capacitance, and linearity and accuracy of on-die termination resistors, may confound designs for use in high-speed applications.

Transmitters are used to ensure the successful transmission of data traversing the communications channel. Encoders, equalizers, and drivers are among the components that make up a traditional backplane transmitter. The system designer builds the transmitter with the channel characteristics, including its length, and the data characteristics, including its speed of transmission, in mind.

Each channel may be characterized by an associated channel transfer function. In order to transmit data across the channel, the equalizer ostensibly cancels out the channel loss or reflection induced artifacts. Specifically, equalizers correct for inter-symbol interference, either at the transmit end or the receive end of the communications link. Inter-symbol interference, which is caused by the inherent channel characteristics, such as frequency dependent signal attenuation, results in a spreading of the data pulse beyond the intended time interval. Thus, following the transmission of a "1" bit across the channel, some of the "1" bit may persist within the channel. This remaining portion of the "1" bit may distort or cancel out successful transmission of a successive "0" bit. In effect, equalizers approximate the inverse of the channel transfer function such that only the intended data is obtained at the receive end of the channel.

Digital transmit equalizers are typically implemented using FIR filters. A digital FIR filter in an equalizer implements the following expression:

$$Y = \sum_{i=0}^{N1} a_i x_j + \text{Offset}, \quad (1)$$

where $a_i$ is a coefficient of the filter, $x_i$ is the input data, N is the number of filter taps, and Offset is the bias added to keep the FIR output, Y, non-negative. According to equation (1), there are N input bits, $x_i$, and N coefficients, $a_i$, one for each "tap," or "stage," of the FIR filter. Usually, the coefficients are signed binary fractions, which may be positive or negative.

In order to implement an FIR filter with normalized output values, the coefficients may be scaled to prevent overflow. This may be achieved by selecting the coefficients such that the absolute value of their sum is one. Stated mathematically:

$$\sum_{i=0}^{N1} |a_i| = 1. \quad (2)$$

There are several known methods for implementing an FIR filter in an integrated circuit (IC). One method is to use a look-up table, where all possible output values, Y, for a given set of coefficients, $a_i$, are pre-computed and stored. During normal operation, input data stream bits, $x_i$, are used to address and read out corresponding output value, Y, from the look-up table.

The use of a look-up table for implementing the FIR filter may be undesirable in some circumstances. To implement such a design, the FIR filter may include a central control unit to compute and pre-load the look-up table contents in each transmitter, which may significantly increase the initialization time of the channel. Further, where the coefficients are pre-computed, the number of taps in the FIR filter is generally fixed, rather than being programmable. Thus, where fewer taps are sufficient for the equalizer implementation, such as for shorter channel designs, or where more taps are desired, such as with high-speed servers, look-up table-based FIR filters are not easily modified. This may result in either a non-optimal solution, in which more taps than necessary are utilized, or a complete redesign of the FIR filter. Further, because of the limitations on changes to the number of taps and or coefficient values, look-up table-based FIR filters tend to be difficult to test or debug.

Another method for implementing an FIR filter is to use a multiplier-accumulator, or MAC, to perform the calculations. MAC-based FIR filters are typically software-configurable, modular designs with a programmable number of taps and coefficients. Such FIR filters may thus be suitable for supporting changing channel environments. A MAC-based FIR filter may support a wide variety of transfer functions, for example, those associated with a short channel environment, such as a desktop personal computer (PC), or those associated with a longer channel environment, such as a server application, with merely a change in the programming parameters.

Like look-up table-based FIR filters, MAC-based FIR filters also have shortcomings. For one, the MAC-based design involves substantial power and area requirements. Additional hardware may also be included to compute the offset, which may increase the initialization time of the filter. Interleaving of multiple FIR filters may be incorporated in the design in order to meet specifications for high-speed operation, adding to its complexity.

Other components in the transmitter may present design challenges as well. The driver, which translates incoming data, usually in digital form, into an analog waveform, suitable for transmission over the channel. Typically, drivers consist of transistors and resistors to operate in either voltage-mode or current-mode topology. It is usually easier to operate with currents than with voltages; hence, current-mode drivers tend to be more popular for implementing drivers in high-speed I/O applications.

As the supply voltages of integrated circuits continue to drop (current designs supply 1 V or less), the design of highly linear current-mode drivers becomes more challenging, as the voltage "headroom," or available voltage for driving the current, is shrinking, while the driver output voltages typically stay constant or even increase. Techniques to improve the linearity of current-mode drivers may include the use of special long-channel transistors or cascode biasing structures.

These techniques fail to address the high linearity and high output voltage demands of some high-speed I/O environments.

In describing channel transmission and transmitter architectures, reference is made to a "backplane." As used herein, a backplane refers to a communication channel between integrated circuits (ICs), where the ICs may include, but are not limited to, processors, memories, chipsets, digital signal processors, and so on. Traditionally, the ICs are disposed on a printed circuit board (PCB), but the backplane referred to herein may include a communications channel between ICs disposed on distinct PCBs, such that the backplane includes one or more interconnects, traces, and vias. Further, the backplane may include connections between ICs over cables, wires, or other media not embedded in the PCB, but merely connected thereto.

A traditional backplane transmitter architecture consists of an "output-mux" topology. In such a topology, an analog waveform amplitude is controlled by redundant elements in the driver, each of which is directly connected to the output terminals of the transmitter. That is, with current-mode drivers, the terminals are the current-summing nodes of the driver, where a main driver unit generates most of the current and redundant driver units generate additional current, as needed for equalization, to change total output current. For high-speed data transmission, the design of the transmitter may call for multi-tap (typically, up to six taps) functionality. To extend the traditional "output-mux" topology to support multiple taps in the equalizer, the number of summing nodes in the driver is expected to increase exponentially, leading to parasitic capacitance on the output terminals, which in turn may adversely impact the ability to achieve the desired high-speed operation.

Thus, there is a continuing need for an improved transmitter design, which overcomes the shortcomings of the prior art.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

In accordance with the embodiments described herein, a novel transmitter architecture is disclosed. The transmitter architecture, which includes both a novel equalizer, a novel driver, and a novel topology to connect between the two, may be suitable for high-speed transmission of data across a channel. The equalizer includes a novel two-tap MAC, which may be part of an N-stage, two-way interleaved FIR filter. The two-tap MAC provides substantial power and area savings over conventional MAC-based FIR filter designs, yet may flexibly be implemented in both short channel (e.g., desktop) and long channel (e.g., server) environments. The driver is designed as an N-bit binary-weighted D/A converter, a current-steering implementation, is entirely decoupled from the equalizer design. Its N-bit, binary-weighted driver includes matched unit current generation cells, all of which are fully utilized during each digital-to-analog conversion.

The D/A converter remains unchanged, even when the characteristics of the equalizer are changed. In contrast to the "output-mux" transmitter topology of the prior art, the equalizer and driver are implemented so as to avoid any pre-assigned or hard-wired connection between the equalizer FIR taps and the driver units.

In the following detailed description, reference is made to the accompanying drawings, which show by way of illustration specific embodiments in which the invention may be practiced. However, it is to be understood that other embodiments will become apparent to those of ordinary skill in the art upon reading this disclosure. The following detailed description is, therefore, not to be construed in a limiting sense, as the scope of the present invention is defined by the claims.

As explained above, to manage inter-symbol interference within a channel, a transmitter typically includes an equalizer. Since the equalizer is essentially generating the inverse of the channel transfer function, such function may be accomplished using FIR filters. Particularly for high-speed transmission, look-up table-based FIR filters are undesirable, for the reasons given above. Although MAC-based FIR filter designs are also problematic, the disclosed transmitter includes a MAC-based FIR filter that overcomes many shortcomings found in the prior art. In order to understand the novel aspects of the design, a discussion of MAC-based FIR filter design follows.

Figure 1:
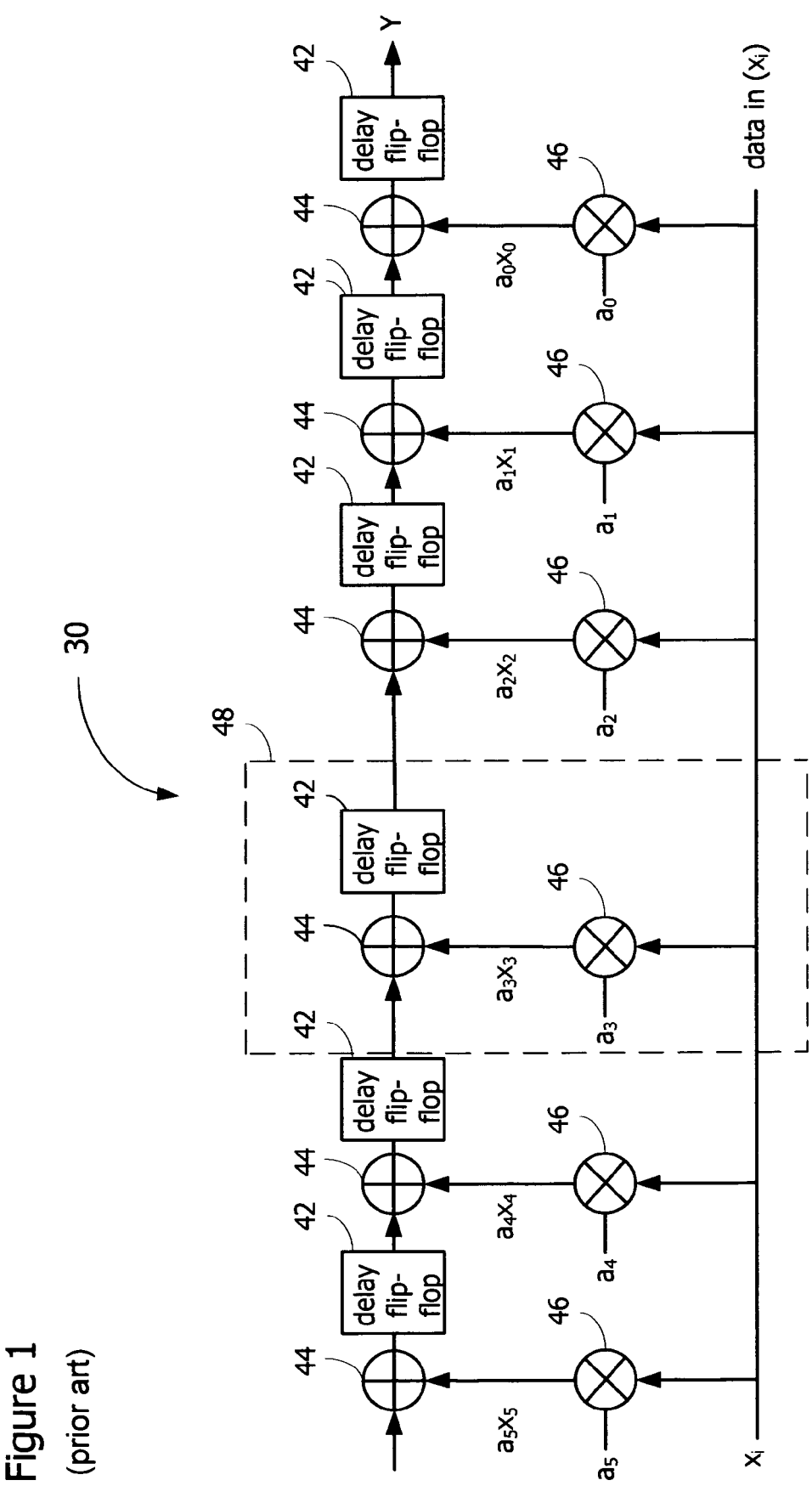
FIG. 1 is a block diagram of a six-tap MAC-based FIR filter design, according to the prior art.

A MAC-based FIR filter 30 is depicted in FIG. 1, according to the prior art. The FIR filter 30 of FIG. 1 is a six-tap FIR filter, meaning that performs six stages of arithmetic operations. The FIR filter 30 solves the following equation:

$$Y = a_0 x_0 + a_1 x_1 + a_2 x_2 + a_3 x_3 + a_4 x_4 + a_5 x_5 \quad (3)$$

where $a_i$ are the coefficients (shown as $a_0$, $a_1$, $a_2$, $a_3$, $a_4$, and $a_5$) and $x_i$ are the input data bits (shown as $x_0$, $x_1$, $x_2$, $x_3$, $x_4$, and $x_5$). The filter 30 includes six delay flip-flops 42, six adders 44, and six multiplexers 46. (Since the input data stream, $x_i$, is one bit wide, multiplexers may be used instead of multipliers in the implementation shown.) A single multiply-accumulate circuit, or MAC, is depicted as a block 48, and includes one adder 44, one delay flip-flop 42, and one multiplexer 46 (or one multiplier, as the case may be).

One limitation of conventional MAC-based FIR filter design is the power and area costs involved, since each taps' N-bit-wide accumulated output is staged. As shown in FIG. 1, there is a MAC 48, including an adder, flip-flop, and multiplexer, for each tap, or stage, of the FIR filter. In a transmitter application, since the FIR filter is designed to produce the inverse of the channel transfer function, the number of taps in the FIR filter may be governed by the channel characteristics. Thus, longer channels may demand more FIR filter taps in order to successfully transmit the data to the receiver.

In implementing the inverse of the channel transfer function, an offset may be added to the FIR filter output to guarantee a non-negative result, accounting for negative tap coefficients (see the variable Offset in equation (1), above). This offset directly depends on and varies with the coefficient values. In one implementation, the offset equals the absolute value of the sum of the negative coefficients in the FIR filter. In MAC-based designs, computation of the offset may be accomplished with additional on-chip hardware. This may result in additional port initialization time whenever the filter coefficients are updated, due to the recalculation of the offset.

To implement FIR filters for high-speed transmission, interleaving techniques may be used. In a two-way interleaved design, for example, two FIR filters operate at half the normal clock rate. The outputs from each FIR filter are then multiplexed to create an output data stream transmitted at the full clock rate.

Figure 2:
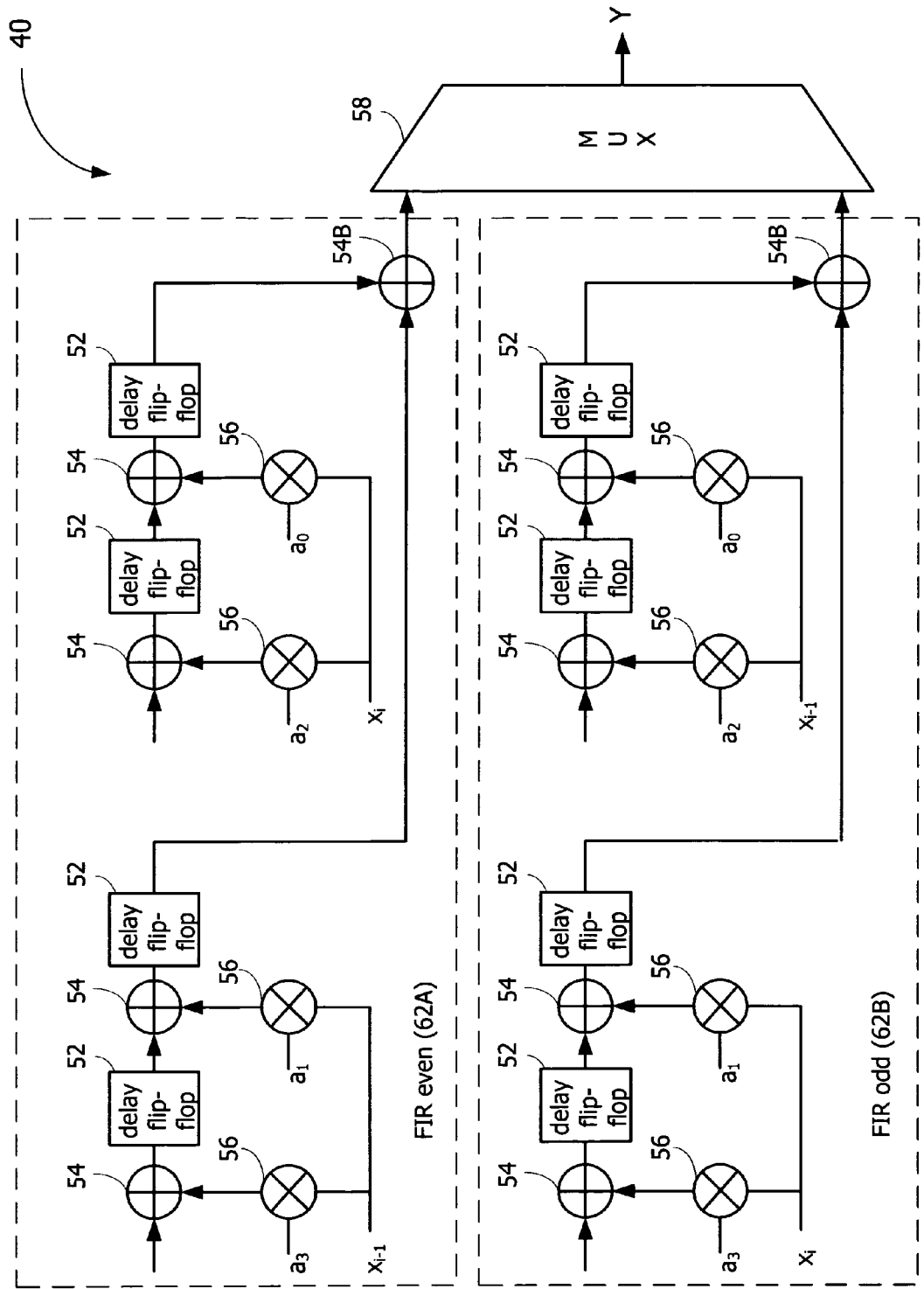
FIG. 2 is a block diagram of an interleaved MAC-based FIR filter design, according to the prior art.

Traditionally, interleaving is accomplished by partitioning each of two FIR filters into an even half and an odd half. In FIG. 2, for example, an interleaved 4-tap FIR filter 40 is depicted, according to the prior art. Four coefficients, $a_0$, $a_1$, $a_2$, and $a_3$, and two data inputs, $x_i$ and $x_{i-1}$, are processed. The upper portion of the figure is an even FIR filter 62A; the lower portion of the figure is an odd FIR filter 62B. The input data, $x_i$ and $x_{i-1}$, is simultaneously fed to the even FIR filter 62A and the odd FIR filter 62B, as each of the filters 62A and 62B produces a partial sum. Two additional adders 54B and a MUX 58 (which are not part of an un-interleaved design) are used to combine the partial sums, producing the output, Y. As the number of taps increases, the complexity of the interleaved arrangement may likewise increase.

Scaling the FIR filter 30 (FIG. 1) or the interleaved FIR filter 40 (FIG. 2) to meet high-speed design criteria may become quite complex, especially when the number of taps (coefficients) is large. MAC-based FIR filters already consume more area relative to look-up table-based designs. Adding hardware to calculate the offset and to support interleaving may render multi-tap MAC-based FIR filter designs impractical for some high-speed and long-channel environments.

Figure 3:
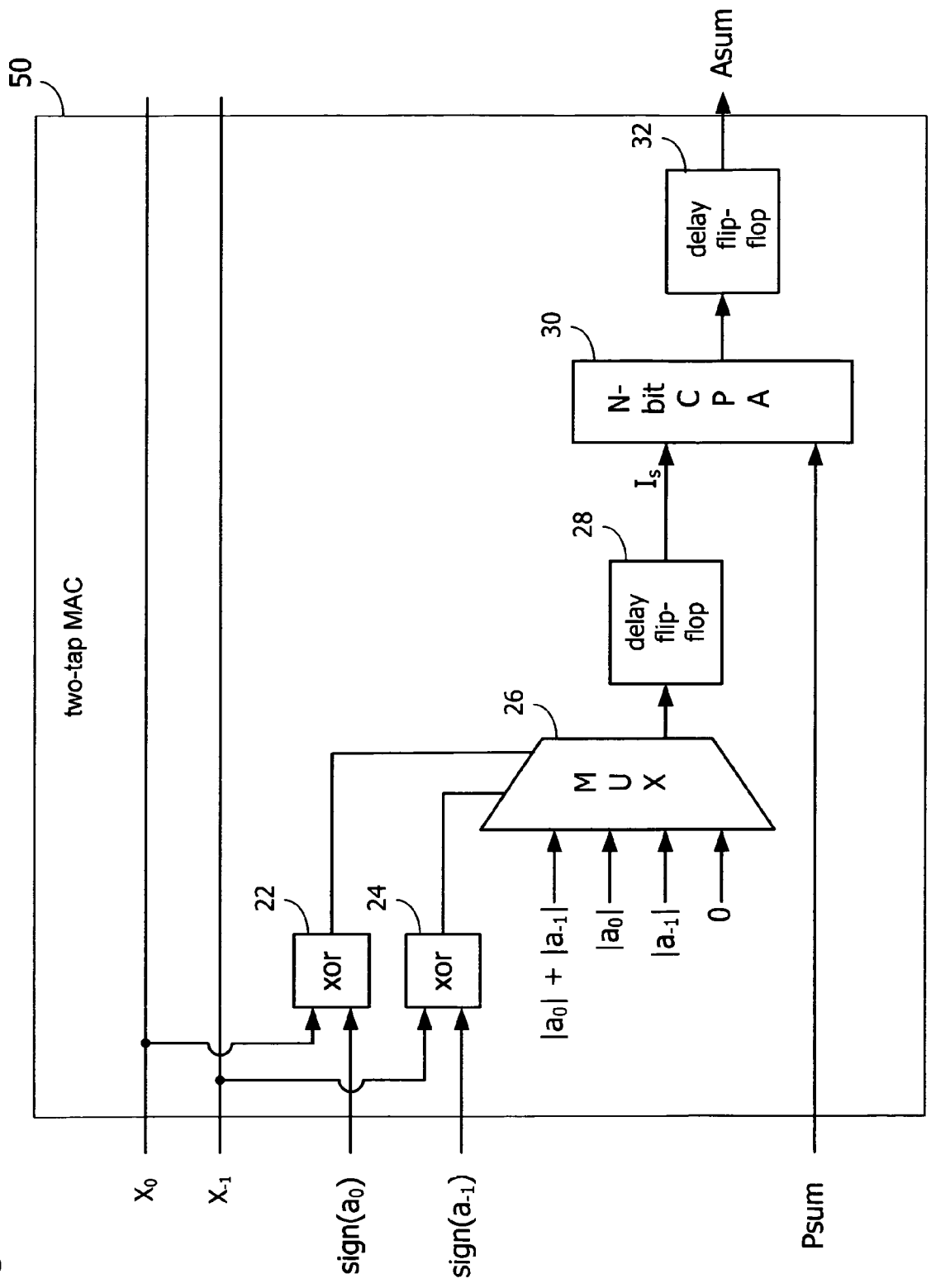
FIG. 3 is a block diagram of a self-adjusting two-tap MAC design, according to some embodiments.

A novel two-tap MAC 50, depicted in FIG. 3, is designed to overcome the limitations of prior art MAC-based FIR filters, according to some embodiments. The two-tap MAC 50 includes XOR logic 22, XOR logic 24, a MUX 26, delay circuits 28 and 32, and an N-bit carry propagate adder (CPA) 30. The two-tap MAC is so named because it performs the partial multiply and accumulate operations for two coefficients, $a_0$ and $a_{-1}$, with two data inputs, $x_0$ and $x_{-1}$, rather than performing a single multiply and accumulate operation, yet includes a single multiply circuit (the MUX 26) and a single addition circuit (the CPA 30). Although the circuit 50 is a single MAC circuit, it processes two coefficients. Thus, the moniker "two-tap MAC" for the circuit 50 is appropriate.

Recall that conventional FIR filter implementations include pre-computation of the offset (see equation (1)), which is done to keep the filter outputs unsigned, i.e., non-negative. Pre-computation of the offset usually involves additional hardware. By contrast, the two-tap MAC 50 includes taps that automatically compute the offset locally, without additional hardware.

Consider a two-tap MAC contribution, $I_s$, in a FIR filter. In a self-adjusting two-tap MAC, the local tap's contribution, $I_s$, may be written as:

$$I_s = a_0 x_0 + a_{-1} x_{-1} + \text{offset} \quad (4)$$

where $$\text{offset} = |a_0|\text{sign}(a_0) + |a_{-1}|\text{sign}(a_{-1}) \quad (5)$$

(Recall that the offset is the absolute value of the sum of the negative coefficients in the filter.) Further, $$\text{sign}(C) = 0 \text{ if } C >= 0 \text{ and } 1 \text{ if } C < 0. \quad (6)$$

Equation (6) ensures that only negative coefficients are added together. Using equation (6), $$a_0 = |a_0|[1 - 2\text{sign}(a_0)] \text{ and } a_{-1} = |a_{-1}|[1 - 2\text{sign}(a_{-1})]. \quad (7)$$

From equations (4), (5), and (7), it may be concluded that:

$$I_s = |a_0|[x_0(1 - \text{sign}(a_0)) + \text{sign}(a_0)(1 - x_0)] + |a_{-1}|[x_{-1}(1 - \text{sign}(a_{-1}))(1 - x_{-1})] \quad (8)$$

Logically, $$[1 - \text{sign}(a_0)] = \text{sign}(a_0)' \text{ and } [1 - x_0] = x_0', \quad (9)$$

which implies that $$I_s = |a_0|(x_0 \text{ xor sign}(a_0)) + |a_{-1}|(x_{-1} \text{ xor sign}(a_{-1})). \quad (11)$$

Equation (11) is implemented in the two-tap MAC 50 depicted in FIG. 3. It should be clear from the above equations that a two-tap MAC implementing equation (11) does not require any additional external hardware to compute the offset. Such an implementation is capable of automatically computing the offset and adjusting the output accordingly. For this reason, the two-tap MAC 50 is referred to herein as a "self-adjusting" MAC.

Equation (11) is implemented using the XOR gates 22 and 24 and the MUX 26. The 4-input MUX 26 receives inputs $|a_0|+|a_{-1}|$, $|a_0|$, $|a_{-1}|$, and 0, such as from a coefficient generator. Data inputs, $x_0$ and $x_{-1}$, as well as sign($a_0$) and sign($a_{-1}$), are fed into XOR gates 22 and 24, respectively. An exclusive-or operation between the data input, $x_0$, and sign($a_0$) produces one control input into the MUX 26; an exclusive-or operation between the data input, $x_{-1}$, and sign($a_{-1}$) produces a second control input into the MUX 26. Given that the control inputs may be either 0 or 1, from equation (11), above, the possible output values of the operation are either 0 ($x_0 x_{-1}=00b$), $|a_0|$ ($x_0 x_{-1}=10b$), $|a_{-1}|$ ($x_0 x_{-1}=01b$), or $|a_{-1}|+|a_0|$ ($x_0 x_{-1}=11b$).

The delay flip-flop 28 delays the output from the MUX 26 to match the incoming Psum data. The output from the MUX 26, shown as $I_s$, or intermediate sum, and Psum, which may be thought of as a partial sum or previous sum (which is either the N-bit value from a previous two-tap MAC calculation or zero) are fed into the N-bit CPA 30. Psum and $I_s$ are N bits wide, and, once added together in the CPA 30, produce an N-bit Asum, (adder sum or addition sum), a subsequent sum.

Although the two-tap MAC 50 features an N-bit CPA, the circuit may be designed using a different accumulator circuit, including, but not limited to an adder or a carry-save adder. System designers of ordinary skill in the art will recognize that the two-tap MAC 50 may be implemented using logic other than the CPA depicted in FIG. 3.

The novel two-tap MAC 50 improves over prior art MAC-based FIR filter implementations. For one thing, the output, Asum, is non-negative. Thus, it is not necessary to carry a sign bit in the CPA 30. If the coefficients, $a_0$ and $a_{-1}$, are represented as signed binary fractions, no subtractions are performed, just additions. In some embodiments, the two-tap MAC 50 consumes less area and has lower power consumption than with single-tap MAC implementations. Since the CPA 30 is N bits wide and includes no subtract logic, the two-tap MAC is faster than single-tap MACs, in some embodiments. Where the width, N, of the CPA 30 is small, for example, improvements in speed may be significant.

In FIG. 3, the coefficients, $a_0$ and $a_{-1}$, are designated such that the N-bit CPA 30 does not overflow. Thus, where $I_s$ is a six-bit input and Psum is a six-bit input, the output from the N-bit CPA 30 is also six bits in length. The Psum shown coming into the two-tap MAC 50, may be a partial sum coming from a previous two-tap MAC. Likewise, the Asum emerging from the delay flip-flop 32 may be fed into a subsequent two-tap MAC. Thus, a series of two-tap MACs 50 may be easily connected together.

As compared to a conventional MAC design, the more compact two-tap MAC 50 of FIG. 3 may offer substantial savings in power and area. In some embodiments, a savings of approximately 50% relative to prior art MAC designs, has been realized. Since the two-tap MAC 50 is self-adjusting, which eliminates the need for additional on-chip hardware to compute the offset, additional savings may be realized. In some embodiments, the offset correction scheme of the two-tap MAC 50 saves 20% in power and area over conventional designs. Further, since the modulus of the coefficients $a_0$ and $a_{-1}$ of the two-tap MAC 50 are used in computations and set so that additions (no subtractions) are performed by the N-bit CPA 30, an enhancement in speed of the two-tap MAC 50 over conventional designs may be realized. In some embodiments, the speed due to the narrow CPA may be enhanced by up to 10%.

The two-tap MAC 50 may be used in an equalizer or in other FIR filter designs. In comparison to conventional MACs, in which a single coefficient is summed in each stage, the two-tap MAC sums two coefficients with a single MAC function. This reduces the number of adders, flip-flops, and other combinational logic by as much as half over prior art MAC designs. In addition to solving the power and area requirements of conventional MAC designs, the disclosed two-tap MAC also eliminates the need for additional control logic used to compute the offset (see equation (1), above). Further, the design of the two-tap MAC is well suited to performing interleaving operations, which are common in high-speed operating environments.

Figure 4:
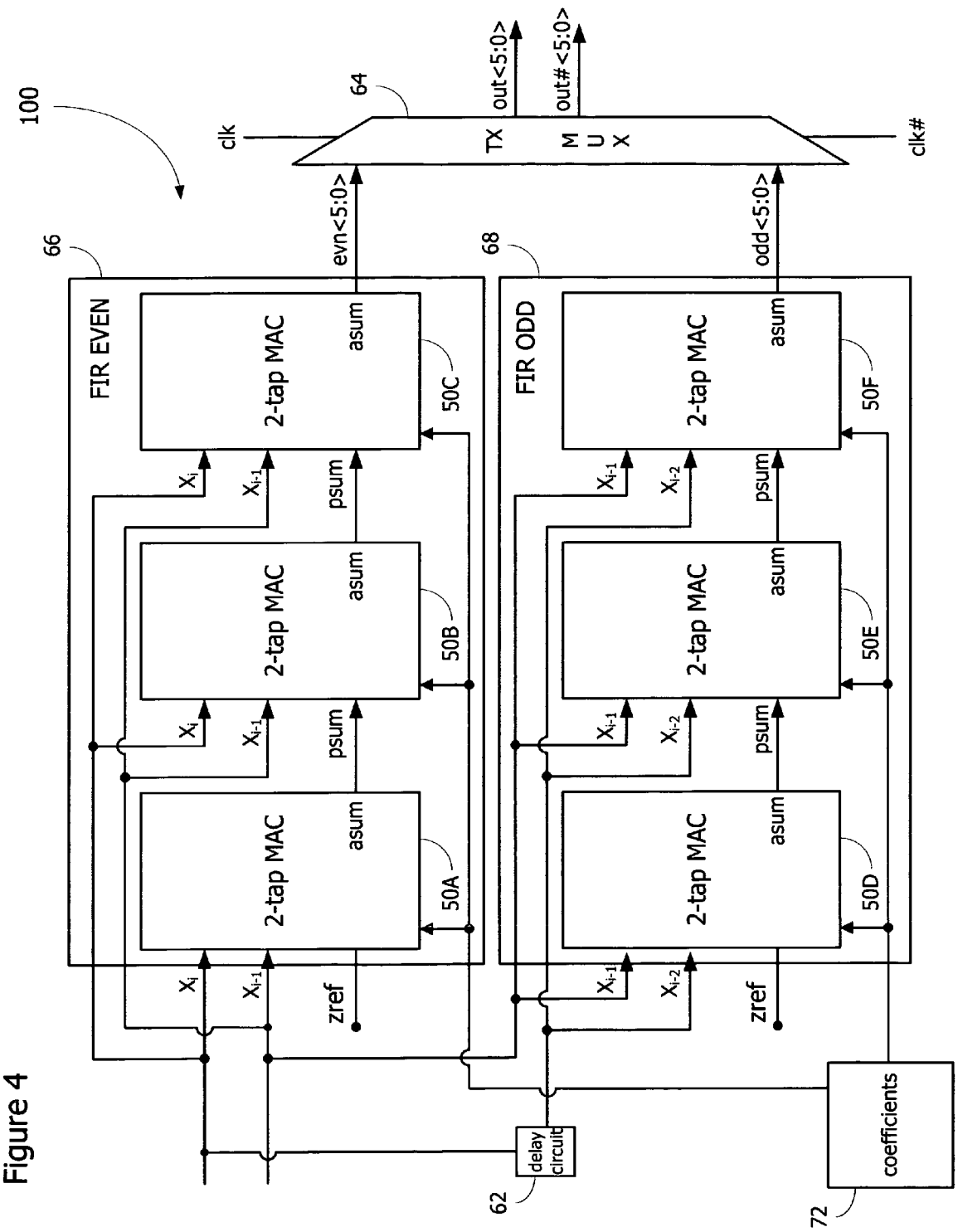
FIG. 4 is a block diagram of a six-tap, interleaved FIR filter using the two-tap MAC of FIG. 3, according to some embodiments.

An equalizer 100 including multiple two-tap MACs 50 is featured in FIG. 4, according to some embodiments. The equalizer 100 includes two FIR filters, FIR even 66 and FIR odd 68, each including three two-tap MACs 50. The MACs 50A, 50B, and 50C are part of FIR EVEN 66; MACs 50D, 50E, and 50F are part of FIR ODD 68. The FIR EVEN filter 66 receives inputs $x_i$ and $x_{i-1}$ while the FIR ODD filter 68 features inputs $x_{i-1}$ and $x_{i-2}$. Coefficients 72, such as the coefficients, $a_0$ and $a_{-1}$, of FIG. 3, are received into each two-tap MAC.

In the FIR EVEN filter 66, the first two-tap MAC 50A receives a zref, or zero reference, as its input; its output, Asum, is received into the input, Psum, of the adjacent two-tap MAC 50B; likewise, the output, Asum, from the two-tap MAC 50B is received into the input, Psum, of the adjacent two-tap MAC 50C. A similar arrangement of the two-tap MACs 50D, 50E, and 50F occurs in the FIR ODD filter 68. In FIG. 4, the outputs from FIR EVEN 66 and FIR ODD 68, evn<5:0> and odd<5:0>, are six bits wide. However, the number of bits supported by the equalizer 100 may vary.

As an example, suppose N=6. Then, from equation (1), above, the equalizer solves the expression:

$$Y = a_0 x_0 + a_1 x_1 + a_2 x_2 + a_3 x_3 + a_4 x_4 + a_5 x_5 + \textit{Offset} \quad (12)$$

$$\text{Here, Offset} = \text{offset}_{54} + \text{offset}_{32} + \text{offset}_{10} \quad (13)$$

In the FIR even circuit 66, the first two-tap MAC 50A receives inputs, $x_5$ and $x_4$ and a zero reference, zref, and produces a partial sum expression, $\text{psum} = a_5 x_5 + a_4 x_4 + \text{offset}_{54}$. The psum is fed into the second two-tap MAC 50B, along with inputs, $x_3$ and $x_2$, to produce a second partial sum expression, $\text{psum} = a_5 x_5 + a_4 x_4 + a_3 x_3 + a_2 x_2 + \text{offset}_{54} + \text{offset}_{32}$. The second psum is fed into the third two-tap MAC 50C, along with inputs, $x_1$ and $x_0$, to produce a third partial sum, $\text{psum} = a_5 x_5 + a_4 x_4 + a_3 x_3 + a_2 x_2 + a_1 x_1 + a_0 x_0 + \text{offset}_{54} + \text{offset}_{32} +$ offsets. The two-tap MACs 50D, 50E, and 50F of the FIR odd circuit 68 similarly produce partial sums of the incoming data, delayed by a half-cycle of the clock. All six two-tap MACs simultaneously perform operations on the data.

In some embodiments, both the number of taps and the values of the filter coefficients are software-configurable and thus may be easily changed. Since the two-tap MAC 50 is self-adjusting, the "zref input" into the leftmost MACs (50A and 50D) may be set to zero, under normal operation. During debug and test, however, the zref and the filter coefficients may be adjusted. One application for adjusting the zref and filter coefficients may be during analysis of "receive eye" images of the channel data on an oscilloscope.

In the equalizer 100, the arrangement of the two-tap MACs 50 exploits the fact that two bits from the input data stream, either $x_i$ and $x_{i-1}$ or $x_{i-1}$ and $x_{i-2}$, are available every clock cycle (since equalizer clocks are half-rate). To do so, the two-tap MACs are designed to accept two independent input bits per cycle (i.e. there is no internal staging of data within the two-tap MAC). This fact coupled with the staging logic at the input of the equalizer 100, in which $x_i$ followed by a delay (from delay circuit 62) becomes $x_{i-2}$, eliminates the need for signal crossing between the FIR even 66 and the FIR odd 68 filters. An unbroken stream of input sequence is thus created and fed to both the even half and the odd half of the equalizer 100. Hence, complicated even/odd schemes generally associated with MAC-based interleaved FIR filters are not necessary for the two-tap MAC-based equalizer 100.

The two-tap MAC 50 may have comparable power and area characteristics to an FIR filter implemented using a look-up table. Nevertheless, the initialization time of the equalizer 100 of FIG. 4 is much shorter than for equalizers that include look-up table-based FIR filters, according to some embodiments. Advantageously, the equalizer 100 of FIG. 4 is capable of rapid port re-initialization, which may be particularly beneficial during test or debug conditions. The zref, which are input to the FIR even 66 and FIR odd 68 filters, are normally set to zero, since the two-tap MACs 50 contained therein are self-adjusting. Nevertheless, the coefficients and filter zref may be modified at any time, for maximum flexibility. Further, it is possible to do a fast shmoo of the "received eye" image of the data by scaling the transmitter coefficients and zref. The short initialization time and the ability to easily modify the coefficients and the self-adjusting nature of the taps may make the equalizer 100 suitable for environments in which adaptive equalization is desired.

Overall, the two-tap MAC 50 results in 70% reduction in area, 60% reduction in power, 10% speed improvement and 20% reduction in latency when compared to a similar design using prior art MACs, according to some embodiments. Since the savings are achieved per bit, the cumulative power/area savings for a microprocessor or chipset may be substantially higher. In some embodiments, for example, the estimated savings for each per-bit equalizer is 15 mW. Given that some microprocessor-based environments, such a server systems, may include more than twenty transmitters in each port and up to six ports in each microprocessor or chipset, power savings amounting to two or more watts over prior art designs may be realized using two-tap MAC-based equalizers.

The multi-tap, software-configurable equalizer 100 of FIG. 4 may be useful in achieving data transmission rates higher than 3.2 GT/s over server-type backplane interconnects or other long-length channels, in some embodiments. Designing another part of the transmitter, the D/A converter, to operate in such a high-speed environment, presents its own set of challenges.

Figure 5:
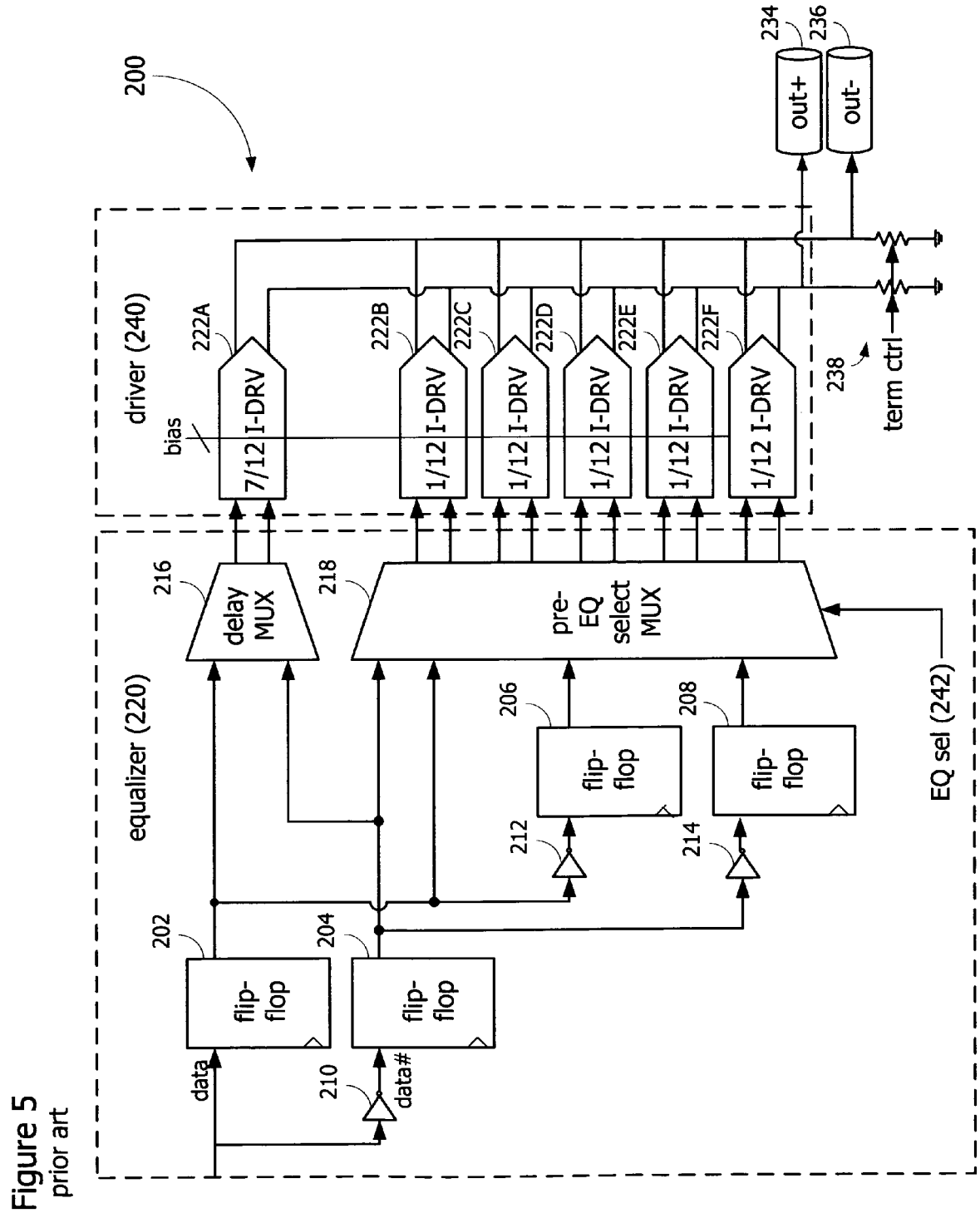
FIG. 5 is a block diagram of a transmitter including an equalizer and a driver, according to the prior art.

A block diagram of a transmitter 200, including an equalizer 220 and a driver 240, is depicted in FIG. 5, according to the prior art. The equalizer 220 receives the channel data, equalizes the data according to the channel characteristics, and sends the equalized data to the driver 240, where the digital data is converted to an analog signal, to drive the appropriate amount of current through the communications channel (out+ 234 and out− 236).

The equalizer 220 includes flip-flops 202, 204, 206 and 208, inverters 210, 212, and 214, a delay MUX 216, and a pre-equalization selection MUX 218. The channel data, "data" and "data#," are differential signals fed into the flip-flops 202 and 204, to be received into the delay MUX 216. (As used herein, signal, data#, is the complement of signal, data.) A portion of the data from the flip-flops 202 and 204 is fed into the pre-equalization select MUX 218, another portion is inverted and fed into flip-flops 206 and 208, whose output are then received into the pre-equalization select MUX 218.

The driver 240 includes twelve unit cells 222A, 222B, 222C, 222D, 222E, and 222F (collectively, unit cells 222). The unit cells generate the current that forms the analog output. Seven of the unit cells, shown as 7/12 I-DRV 222A, are connected directly to the output of the delay MUX 216 in the equalizer 220, and forms a main driver unit of the driver 240. These unit cells 222A are thus hard-assigned to the digital bit that is being converted. The remaining five unit cells, 1/12 I-DRV 222B, 222C, 222D, 222E, and 222F, forming redundant units of the driver 240, are connected directly to the pre-equalization select MUX 218. By programming an equalization select 242, the unit cells 222B-222F are selectively turned on when the digital input changes. As used herein, reference to "driver unit" or "driver units" are meant to include the main driver unit, one or more redundant driver units, or the main driver unit and the redundant driver units.

In the equalizer 220, the pre-equalization select MUX 218 compares the current data to the previous data, or historical data. Where a transition of the incoming data occurs (e.g., from "0" to "1" and vice-versa), one or more of the unit cells 222B-222F, which are part of the driver 240, are turned on. The equalization select input 242 into the pre-equalization select MUX 218 determines the "strength" of the equalization, or number of unit cells to be activated, based on the characteristics of the channel. The delay MUX 216 ensures that activation of the selectable unit cells (222B-222F) occurs simultaneously with the activation of the seven unit cells 222A. Some or all of the additional 1/12 unit cells 222B-222F may be turned on when the current data and the previous data are different.

The equalizer 220 of FIG. 5 is a two-tap equalizer. To expand the transmitter 200 to support a six-tap software-configurable equalizer with six bits of binary-coded resolution levels (desirable for high-speed communication through some channels) would result in the following changes for the driver 240. Instead of twelve unit cells 222 being connected directly to the equalizer taps, the design would include $2^6-1$, or sixty-three, unit cells per tap. Thus, 6×63, or 378, unit cells would be connected to the equalizer 220. In addition to the substantial area consumed by such a configuration, a dramatic increase in parasitic pad capacitance may be expected.

Further, since five unit cells (unit current cells 222B, 222C, 222D, 222E, and 222F) are optionally used (depending on the desired equalization strength) in the prior art transmitter 200, expanding the design of FIG. 5 to a six-tap environment, with 378 unit cells, greatly increases the number of "optionally" used cells. A design in which many unit cells are sporadically used would be inefficient. Benefits obtained using a multi-tap equalizer may be diminished using such an unefficient "output-mux"-based transmitter topology, since an increase in the number of unit cells results from an increase in the number of taps in the equalizer. The interrelationship between the equalizer and the driver thus creates a barrier to increasing the data rate of the communications channel.

Figure 6:
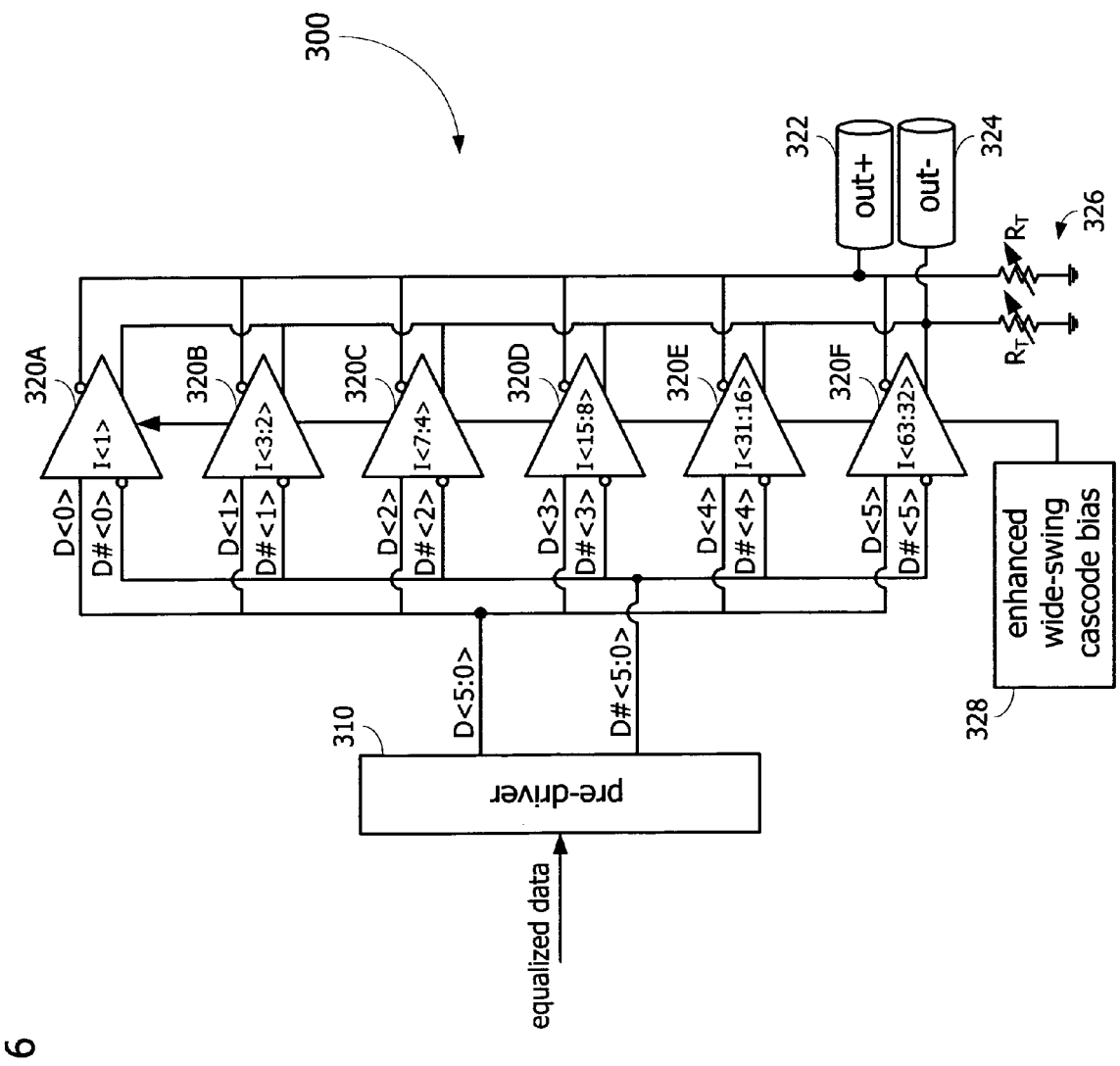
FIG. 6 is a block diagram of a D/A converter for use in a transmitter, according to some embodiments.

Accordingly, a novel D/A converter 300 is depicted in FIG. 6, in some embodiments. The D/A converter 300 is a binary-weighted architecture, including sixty-three identical unit cells, shown as unit cells 320A, 320B, 320C, 320D, 320E, and 320F (collectively, unit cells 320). Using a shorthand notation, I<1> 320A is a single unit cell; I<3:2> 320B is two identical unit cells; I<7:4> 320C is four identical unit cells; I<15:8> 320D is eight identical unit cells; I<31:16> 320E is sixteen identical unit cells; I<63:32> 320F is thirty-two identical unit cells.

Since the unit cells are made up of active components (transistors), the D/A converter 300 also functions as a driver, driving the appropriate amount of current to the differential output lines, out+ 322 and out− 324. In some embodiments, the D/A converter 300 is a current-mode driver. A current-mode driver draws a known amount of current, regardless of changes to the load and other operating conditions. Current-mode drivers are also known to have high output impedance, which may be useful to achieve high linearity in the driver.

According to the six-bit, binary-weighted architecture of the D/A converter 300, all unit cells 320 are equally sized and may deliver 1/63 of the total current. Since the design is binary-weighted, each digital bit produces current as specified in FIG. 6. For example, a "1" on the least significant bit (LSB), D<0>, will turn on unit cell I<1>, which transmits current to the output, out+. A "1" on the next bit, D<1>, will turn on two unit cells, I<3> and I<2>, which will transmit twice the current to the output as was produced by the unit cell I<1>. A "1" on D<3> will turn on four unit cells, I<7>, I<6>, I<5>, and I<4>, transmitting four times the current to the output as was produced by the unit cell I<1>. In this manner, an analog signal is produced from the incoming digital data.

The current-steering architecture of the D/A converter 300 provides high-speed operation and minimizes di/dt noise on the power supply rail. As shown in FIG. 6, the least-significant bit (LSB) of the incoming data, D<0>, is connected to one unit cell (320A), whereas the most-significant bit (MSB), D<5>, is connected to thirty-two unit cells (320F). The total of sixty-four possible combinations of six-bit wide incoming data corresponds to sixty-four possible levels of current flowing into the output pads. Since the data coming into the unit cells 320, D<5:0> and D#<5:0> are logically complementary, at each given point of time, N unit cells are connected to the out+ line 322 and 63-N unit cells are connected to the out− line 324.

Current flowing out of the unit cells 320 in the D/A converter 300 flow into on-die termination resistors 326, as well as to the output transmission lines out+ 322 and out− 324. This current flowing generates output voltage. In some embodiments, fully differential signaling is ground referenced with $V_{OL}=0$ volts and $V_{OH}<500$ mV, corresponding to approximately 20 mA of DC current drawn from a power source per transmitter lane.

Figure 7:
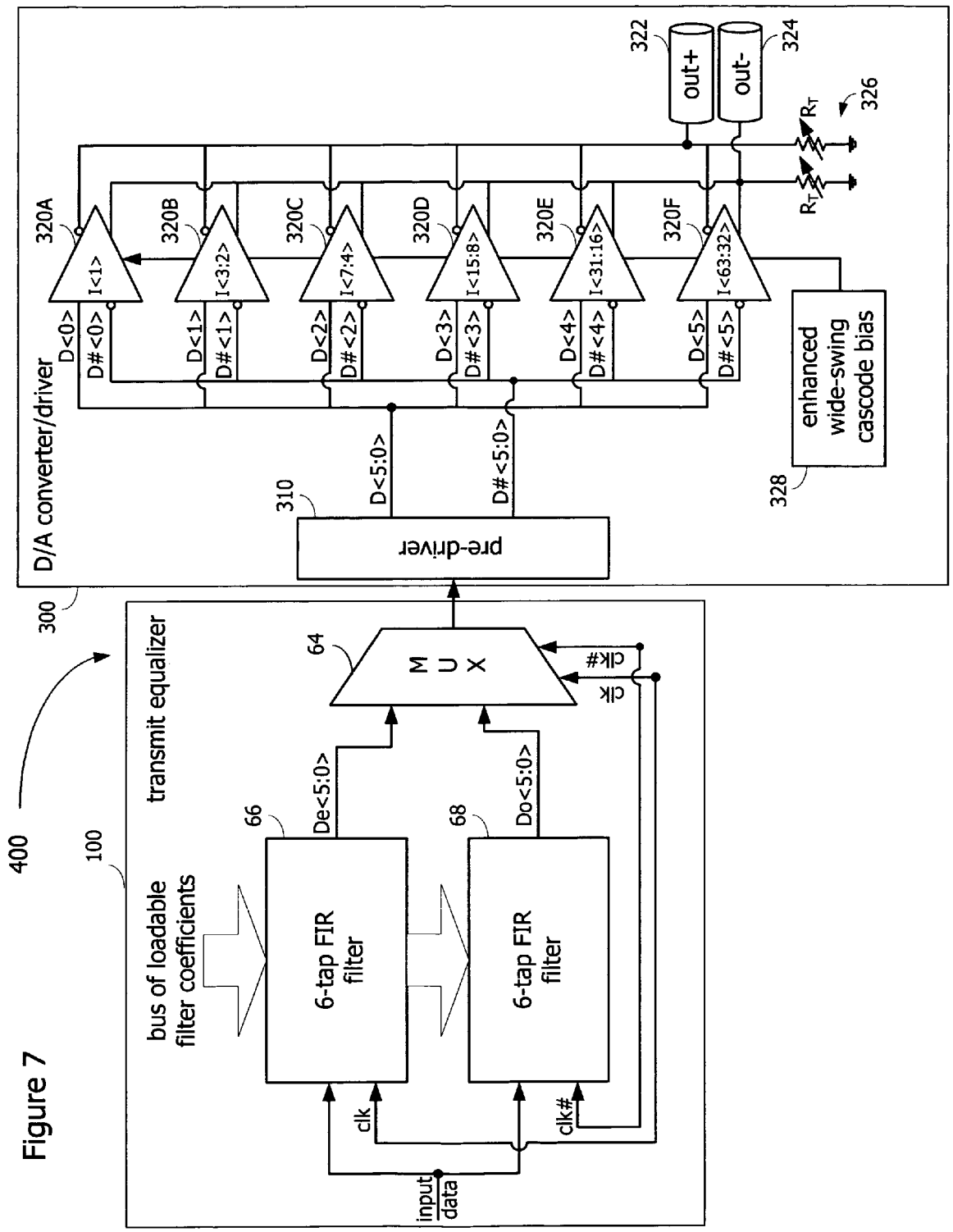
FIG. 7 is a block diagram of a transmitter including an equalizer with the six-tap, interleaved FIR filter of FIG. 4 and the D/A converter of FIG. 6, according to some embodiments.

The D/A converter 300 may be part of a novel transmitter architecture 400, as in FIG. 7, according to some embodiments. The transmitter architecture 400 includes the transmit equalizer 100 from FIG. 4 and the D/A converter 300 from FIG. 6. Two six-tap FIR filters 66 and 68 process an incoming stream of serially sequenced one-bit-wide digital data intended for transmission through the channel to reflect the six-tap FIR functionality. As a result, the equalizer 100 maps every single incoming bit of data into two six-bit-wide words in binary format. These words are fed to the MUX 64, to be received into the D/A converter 300. In some embodiments, the equalizer 100 is software configurable, such that both the number of taps and the values of the filter coefficients may be readily changed.

As the block diagram of FIG. 7 shows, the transmit equalizer 100 is entirely decoupled from the D/A converter 300. By decoupling the two portions of the transmitter 400, issues associated with high-speed transmission, long channel lengths, and other modern design considerations, may be separately solved by the system designer. That is, the problem of designing a transmit equalizer to address design issues may be solved purely in the digital domain while the D/A converter issues are solved in the analog domain. The transmitter 400 of FIG. 7 thus avoids the tradeoff between the number and values of transmit equalizer taps on the one hand and the complexity, area, and impact to the pad capacitance of the unit cells in the D/A converter on the other hand.

The transmit equalizer 100 is implemented as a multi-tap finite impulse response (FIR) filter in the form of a two-way interleaved, scalable, soft-reconfigurable, adjustable arithmetic logic unit, essentially performing the role of a digital signal processor. According to the configuration shown, since the data is double-pumped, the incoming data stream is processed, multiplied, and added through up to six processing stages, representing up to six supported taps. The taps are designed in a modular fashion, allowing power and area savings for applications requiring fewer taps, such as short desktop backplane channels. The even and odd outputs of the FIR filters 66 and 68, De<5:0> and Do<5:0>, are fed into the MUX 64, which performs 2:1 multiplexing and then feeds the output to a pre-driver 310 of the D/A converter 300. The pre-driver 310 conditions the current prior to being received into the unit cells 320. The clocked 2:1 multiplexing of the transmit equalizer 100 creates a data stream at twice the transmit clock rate. Although the equalizer 100 of FIG. 7 is depicted as having six taps and transmitting six bits, any number of taps or bits may be implemented in the equalizer 100 as used in the transmitter 400.

In some embodiments, the D/A converter 300 is capable of running at speeds greater than 10 GT/s. The D/A converter 300 may be connected to an equalizer with virtually any number and value of taps. As described further, below, the design of the D/A converter 300 minimizes the pad capacitance, regardless of the complexity of the equalizer. Since sixty-three unit current cells 320 are connected to a pad and all sixty-three unit current cells are used at any given transmission unit interval, the design of the driver 300 is efficient, when compared to prior art solutions. The driver 300 is also capable of supporting multi-level signaling, which may enable the signaling rate to be pushed higher for future generations of high-speed FR4-based back plane buses.

Figure 8:
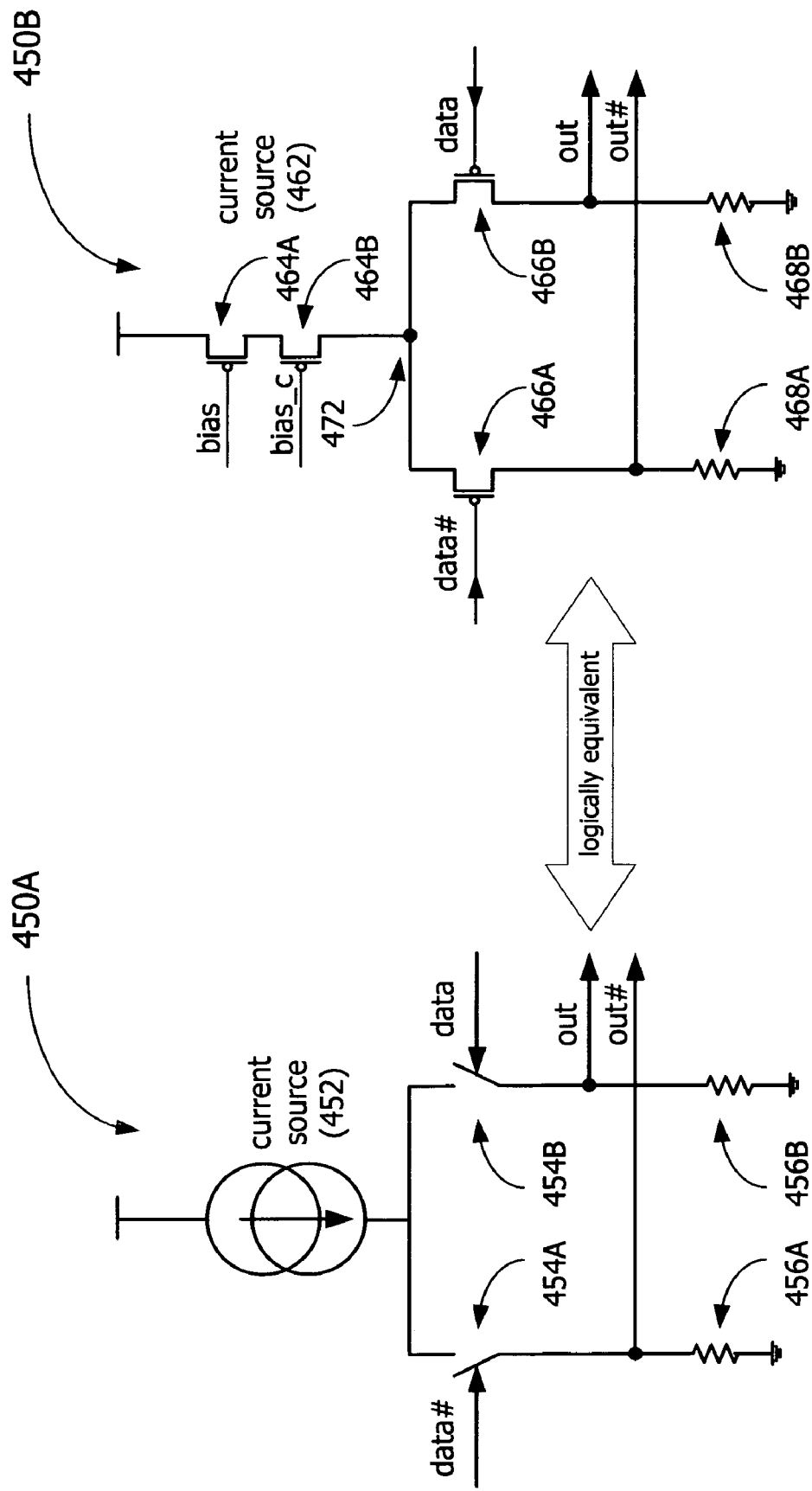
FIG. 8 is a block diagram of equivalent current sources, according to the prior art.

The D/A converter 300 also operates as a driver, to drive sufficient current for transmitting the data across the communications channel. A precise, current-mode, current-steering circuit may be preferred for high-speed transmission of data across a channel. Where the communications interface is ground-referenced, the driver is typically based on p-channel metal oxide semiconductor (PMOS) transistors. Two conventional equivalent drivers 450A and 450B are depicted in FIG. 8, according to the prior art.

The driver 450A includes an ideal current source 452, which drives current to out and out#, based on the operation of ideal switch 454A, driven by input, data, and ideal switch 454B, driven by input, data#. When switch 454A is closed by input signal, data#, current flows from the ideal current source 452 to termination resistor 456A, producing voltage, out#. When switch 454B is closed by input signal, data, current flows to termination resistor 456B, producing voltage, out. Accordingly, the incoming data bits, data and data#, produce output voltages, out and out#, respectively.

The driver 450B is a real-world implementation of a driver, the current source 462 being made up of two transistors 464A and 464B, arranged in a cascode. (A cascode is an arrangement of devices in which the output of a common source is connected directly to the input of a common gate.) The gate of the transistor 464A receives a predetermined analog voltage, bias, while the gate of the transistor 464B receives a second predetermined analog voltage, bias_c. The bias voltages, bias and bias_c, bring the transistors 464A and 464B, respectively, into saturation, enabling the cascode arrangement to operate as a current source.

The switches 454A and 454B from the driver 450A are replaced by transistors 466A and 466B. The gate of transistor 466A receives input signal, data#, while the gate of transistor 466B receives input signal, data. When transistor 466A is closed by input signal, data#, current flows from the current source 462 to termination resistor 468A, producing voltage, out#. When transistor 466B is closed by input signal, data, current flows to termination resistor 468B, producing voltage, out. Accordingly, the incoming data bits, data and data#, produce output voltages, out and out#, respectively.

In some environments, the driver 450B is designed to produce as high an output voltage, out and out#, as possible. However, the higher the output voltage, the higher the voltage at node 472. The transistors in the driver 450B are PMOS transistors; an analogous driver may be designed using NMOS transistors. Either way, the transistors will not operate in a desired operating mode, known as saturation, unless the drain-to-source voltage, $V_{ds}$, exceeds the difference between the gate-to-source voltage, $V_{gs}$, and a voltage threshold, $V_{th}$, for the device. With power supply voltages often being 1V or less, a high-voltage output for the driver 450B threatens the ability of the transistors 464A and 464B to operate as current source 462. The gate input to the transistors 464A and 464B, bias and bias_c, should be carefully chosen to ensure that the transistors 464A and 464B operate as a current source.

FIG. 8 thus depicts a practical driver implementation for supplying an output voltage from incoming digital data. As semiconductor technology moves to deep sub-micron processes (i.e., transistors with device channel lengths smaller than 0.5 microns), device channel modulation effects make driver design more difficult. Deteriorating $G_{ds}$ (the drain-source conductance of the transistor) and the reduction of $R_{out}$ of devices in saturation may lead to non-linear behavior of the transistors in the driver. Deterioration in the driver accuracy and linearity may result. Additionally, advances in deep sub-micron technology may lead to an increase in the threshold voltage versus input voltage ratio ($V_{th}/V_{cc}$) of the driver, which may, in turn, result in less voltage dynamic range, where the driver is at least moderately saturated.

Where design specifications call for the driver to provide a predetermined effective number of bits (ENOB) of linearity over a high output voltage range, achieving the driver design may be problematic, particularly given that supply voltages are dropping. For example, where a range of 0-600 mV and five ENOB are specified for a 1 V supply, the driver would need to supply $R_{out}$ of at least 1 Kohm over the entire dynamic range of 0-600 mV. Thus, 1 V minus 600 mV, or 400 mV, would be available for both the current source and the switch transistors of the driver. The threshold voltage, $V_{th}$, is ~380 mV for some PMOS transistors. This means that the transistor needs at least 380 mV at its gate before current will transmit between the drain and the source of the transistor.

Recall that the D/A converter 300 is a current-mode driver, with high output impedance. Since the D/A converter 300 of FIG. 7 is supplying sixty-three lines of current (for a six-bit D/A conversion), the current-mode driver may be implemented using a current mirror. A current mirror consists of a particular arrangement of transistors that supply multiple (usually identical) current sources. Traditional simple current mirrors tend to be inefficient in deep sub-micron technology, especially in applications implementing a high $R_{out}$, such as for I/O drivers. With a simple current mirror, a modest $R_{out}$ and linearity may be achieved at the expense of substantial deterioration in the maximum achievable output voltage swing or "dynamic range." Driver design specifications stipulate that both a high $R_{out}$ and a high maximum output voltage swing, or "dynamic range," be satisfied. In deep sub-micron technologies, for the D/A converter 300, it is not feasible to implement a current-mode driver using a simple current mirror technique, as the linearity and $R_{out}$ requirements would not be satisfied, even by using long channel devices.

Another technique for implementing a current-mode driver is to use a cascoding technique. Conventionally, cascoding is used to boost the output impedance of the current mirror. Since there is not much available voltage for current mirroring, a cascoding current-mode driver may be difficult to successfully implement. If each transistor uses ~380 mV, the driver would be outside the dynamic range with just two transistors. So, even where the cascoding driver improves $R_{out}$, the dynamic range requirement of the device may be violated.

Figure 9:
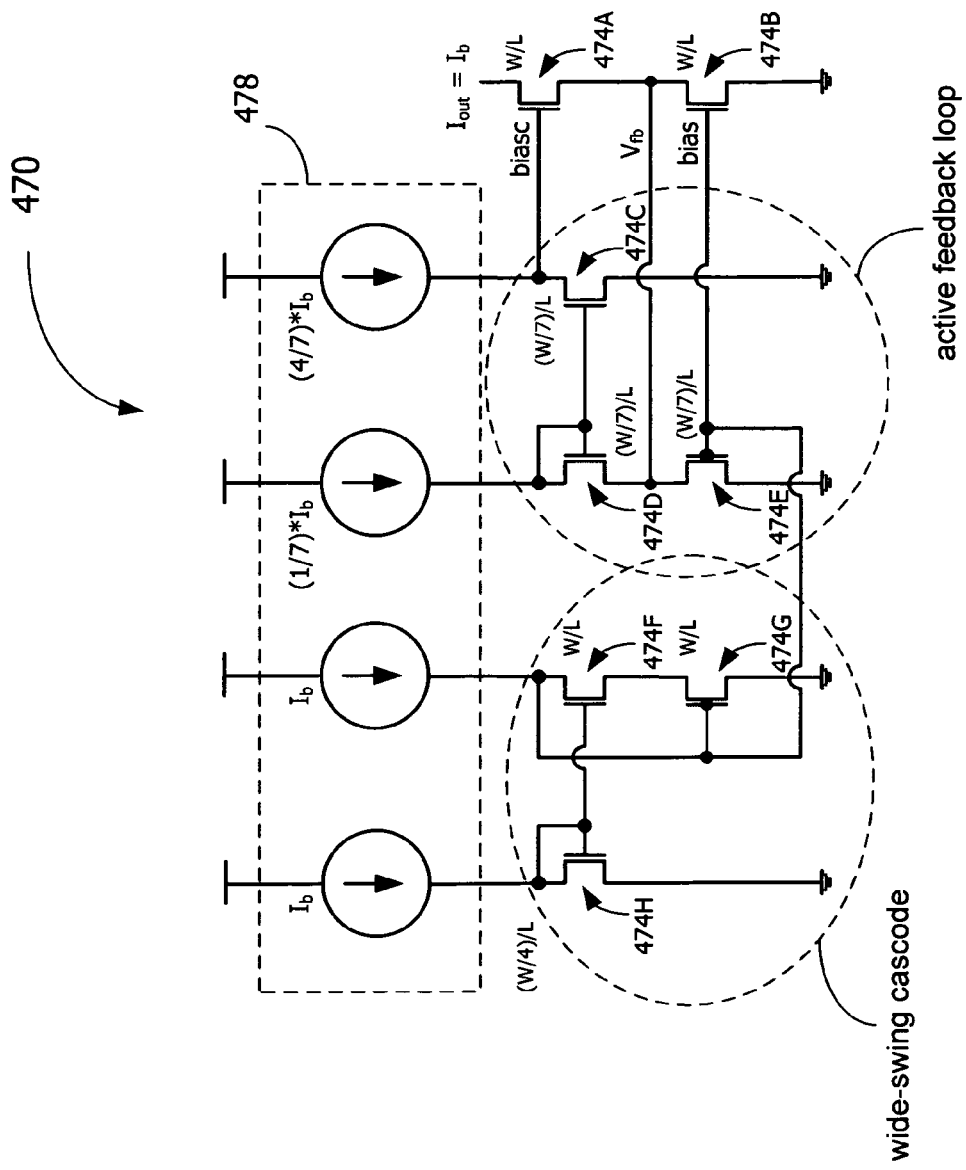
FIG. 9 is a block diagram of a wide-swing cascode current mirror, according to the prior art.

In FIG. 9, a current mirror 470 implements an advanced biasing technique, according to the prior art. The current mirror 470 is a wide-swing cascode current mirror with an active feedback loop to boost the output impedance. Eight transistors 474A-474H of particular dimension receive current from current source 478. Transistors 474F, 474G, and 474H receive current, $I_b$; transistors 474D and 474E receive one-seventh as much current, $\frac{1}{7} I_b$; transistor 474C receives four-sevenths as much current, $\frac{4}{7} I_b$, from the current source 478. Transistors 474A, 474B, 474F and 474G have dimensions W/L; transistors 474C, 474D, and 474E have dimensions (W/7)/L; transistor 474H has dimensions (W/4)/L.

Transistors 474A and 474B form a current source similar to the current source 462 of FIG. 8. Voltages biasc and bias are fed into the gates of transistors 474A and 474B, respectively. There is a wide-swing cascode on transistors 474F, 474G, and 474H. Transistors 474C, 474D, and 474E form an active feedback loop. A voltage at a node between the transistors 474A and 474B is fed back into the circuit, as voltage feedback, $V_{fb}$.

The combination of the wide-swing cascode and active feedback loop techniques significantly boosts the output impedance and dramatically extends the linear dynamic range over some current-mode driver implementations. The transistors depicted in FIG. 9 are n-type MOS (NMOS) transistors; however, the current mirror 470 may be designed using PMOS transistors.

In the transmitter architecture 400 of FIG. 7, the driver is not a current mirror, but a binary-weighted current steering D/A converter. However, each of the unit cells 320 includes a current source, which is typically implemented by devices connected in a current-mirror-like topology. Each of the unit cells 320 may be thought of as a driver such as the driver 450B of FIG. 8. Each unit cell 320 includes a source of current. Each unit cell 320 receives differential data as input (data and data#), and produces differential output (out and out#). Preferably, each unit cell 320 produces a very high output voltage. The current mirror 470 of FIG. 9 features a solution for producing the bias and biasc voltages that will ensure that the cascoded arrangement of transistors are able to maintain a high linearity, a high $R_{out}$, and, as a result, a constant current, while producing a high output voltage, as desired.

Figure 10:
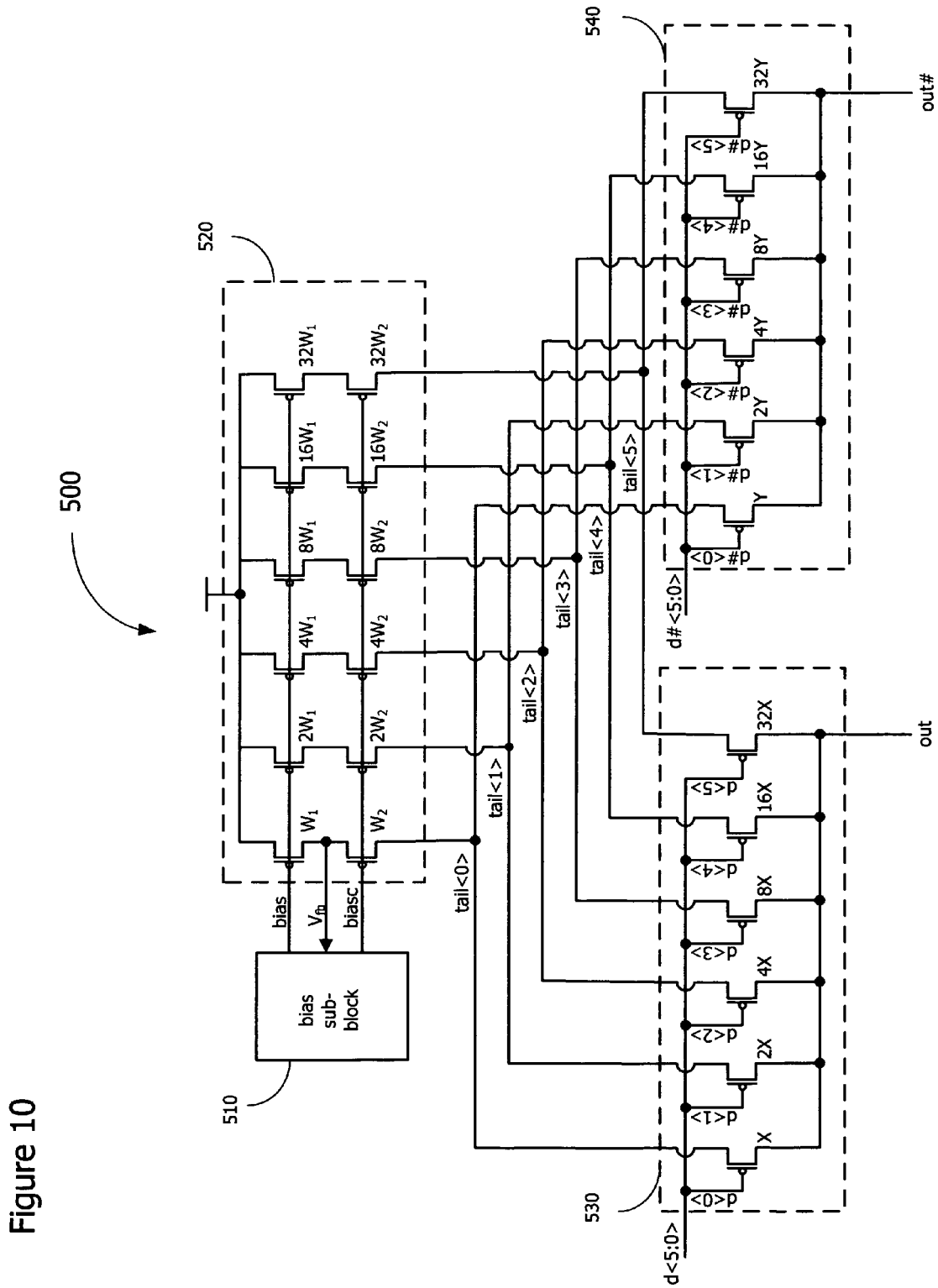
FIG. 10 is a block diagram of a binary-weighted current steering D/A converter, according to some embodiments.

In FIG. 10, the driver 450B of FIG. 8, the advanced biasing current mirror 470 of FIG. 9, and the desired D/A converter 300 of FIG. 7 are inspiration for a novel D/A converter 500, depicted in FIG. 10, according to some embodiments. The D/A converter 500 includes a bias sub-block 510, as well as transistor networks 520, 530, and 540. As with the D/A converter 300, the D/A converter 500 receives a six-bit differential digital input, given by D<5:0> and D#<5:0>, and produces output voltages, out and out#.

The transistor network 520, a binary-weighted current source array, includes one hundred twenty-six transistors (2×63). As with the unit cells 320, a shorthand notation is used in FIG. 10 to represent the binary-weighted arrangement of the transistors. Thus, a transistor labeled $4W_1$ actually represents four identical transistors comprising the top-most transistor of a two-transistor cascode designed to operate as a current source for data bits, d<2> and d#<2>. The transistor labeled $16W_2$ represents sixteen identical transistors comprising the bottom-most transistor of a two-transistor cascode designed to operate as a current source for data bits, d<4> and d#<4>. The transistors labeled $W_1$ are identical; likewise, the transistors labeled $W_2$ are identical.

The transistor network 520 includes dual cascoded transistors that operate as current sources for each incoming data bit, D<0>, D<1>, D<2>, D<3>, D<4>, and D<5>. A pair of transistors, $W_1$ and $W_2$, are the current source for data bits, D<0> and D#<0>; two pairs of transistors, $2W_1$ and $2W_2$, are the current source for data bits, D<1> and D#<1>; four pairs of transistors, $4W_1$ and $4W_2$, are the current source for data bits, D<2> and D#<2>; eight pairs of transistors, $8W_1$ and $8W_2$, are the current source for the data bits, D<3> and D#<3>; sixteen pairs of transistors, $16W_1$ and $16W_2$, are the current source for the data bits, D<4> and D#<4>; thirty-two pairs of transistors, $32W_1$ and $32W_2$, are the current source for the data bits, D<5> and D#<5>. Thus, the nth bit of the data signal and its differential complement are sourced current from $2^n$ transistor pairs (in transistor array 520).

The transistor networks 530 and 540 include sixty-three transistors each. Transistors labeled X, 2X, . . . , belong to the transistor network 530 while transistors labeled Y, 2Y, . . . , belong to the transistor network 540. Each transistor in the transistor network 530 is gated by a data bit, d<i>, for integer, i, and corresponds to transistor switch 466B in the driver 450B (FIG. 8), to produce output voltage, out. Likewise, each transistor in the transistor network 540 is gated by a differential data bit, d#<i>, for integer i, and corresponds to transistor switch 466A in the driver 450B, to produce output voltage, out#. Data bits, d<0> and d#<0>, supply a gate voltage to single transistors (X and Y); data bits, d<1> and d#<1>, supply a gate voltage to two pairs of transistors (2X and 2Y); data bits, d<2> and d#<2>, supply a gate voltage to eight transistors (4X and 4Y); and so on. Thus, the nth bit of the data signal supplies a gate voltage to $2^n$ transistors (in transistor array 530) and the nth bit of the differential complement of the data supplies a gate voltage to $2^n$ transistors (in transistor array 540).

The bias sub-block 510 includes an arrangement of transistors similar to that of the current mirror 470 of FIG. 9, minus the current source transistors (474A and 474B). Instead, the voltages produced by the bias sub-block 510, bias and biasc, are fed to the gates of the transistor pairs in the transistor array network 520. The bias and biasc voltages are sufficient to maintain the cascoded transistor pair (e.g., $W_1$ and $W_2$) as a good current source, regardless of the load. (The bias and biasc voltages are fed into all transistor pairs in the transistor network 520.) A feedback voltage, $V_{fb}$, is taken directly from the binary-weighted current source array and fed back into the bias sub-block 510. In some embodiments, the feedback voltage, $V_{fb}$, is obtained from the least-significant bit (LSB) of the current source array, since alternating current (AC) noise on the LSB is minimal, relative to the more significant bits. In other embodiments, the feedback voltage, $V_{fb}$, is obtained from the most-significant bit (MSB) of the current source array. In still other embodiments, the feedback voltage, $V_{fb}$, is obtained from a bit other than the LSB or the MSB.

Biasing drivers for high-speed I/O designs has traditionally been achieved using either simple current mirrors or simple cascode current mirrors for 130 nm and 90 nm transistor technologies. For 65 nm technology and beyond, however, the traditional biasing methods may result in either a very poor $R_{out}$ or a much smaller dynamic range than is preferred. For example, using a simple current mirror with 65 nm transistors results in an $R_{out}$ of approximately 200 Ohms (about 20% of design specification) and a dynamic range of 200-300 mV (where design specification calls for 600 mV). By contrast, the D/A converter 500 of FIG. 10 is capable of meeting these design criteria, even with 65 nm technology.

Further, the D/A converter 500 may be implemented without significant increases in power and area requirements. In some embodiments, the D/A converter 500 is implemented with less than a one percent increase in power and area requirements over the prior art.

Figure 11:
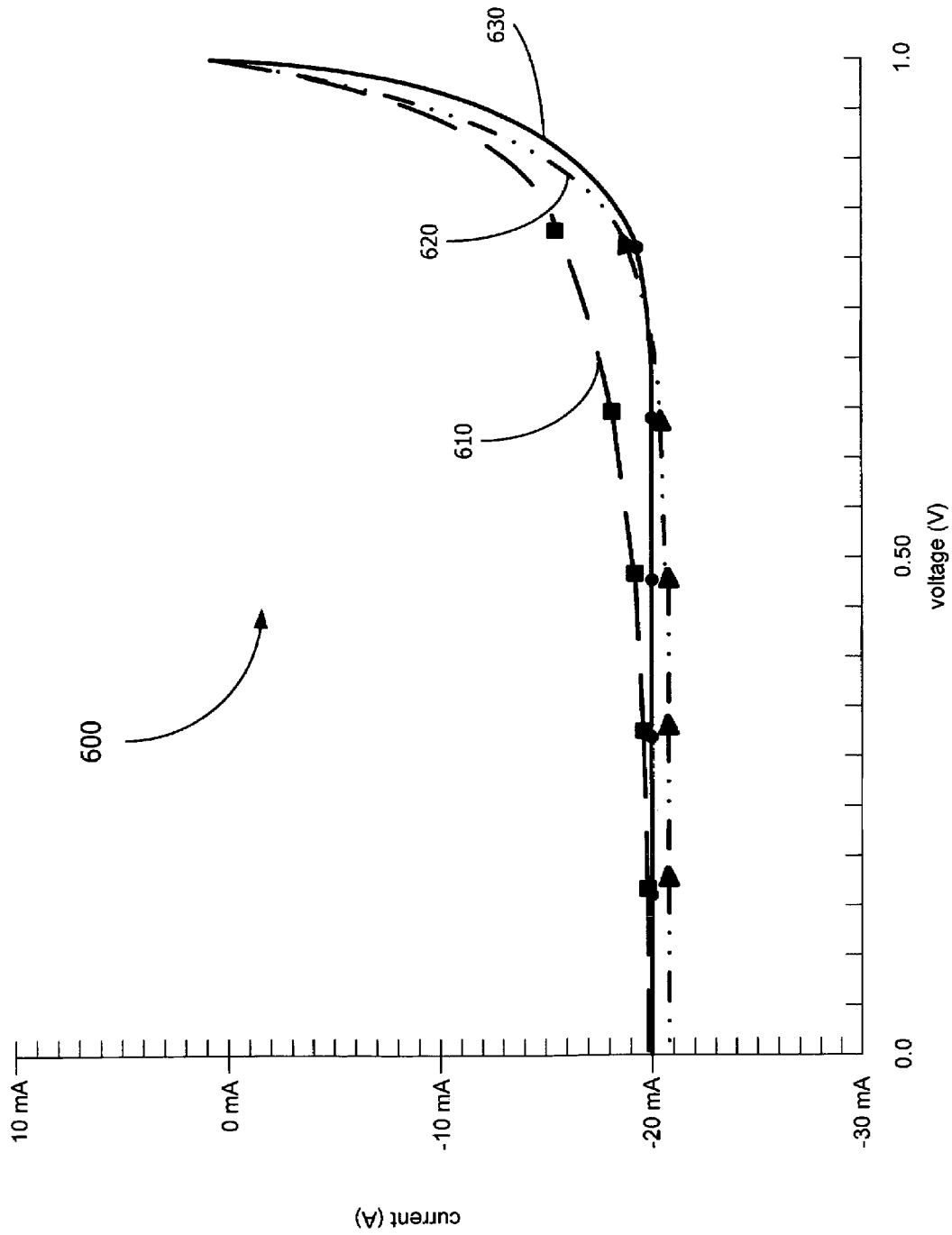
FIG. 11 is a graph of I-V curves for the D/A converter of FIG. 10, three different current generation topologies, according to some embodiments.
Figure 12:
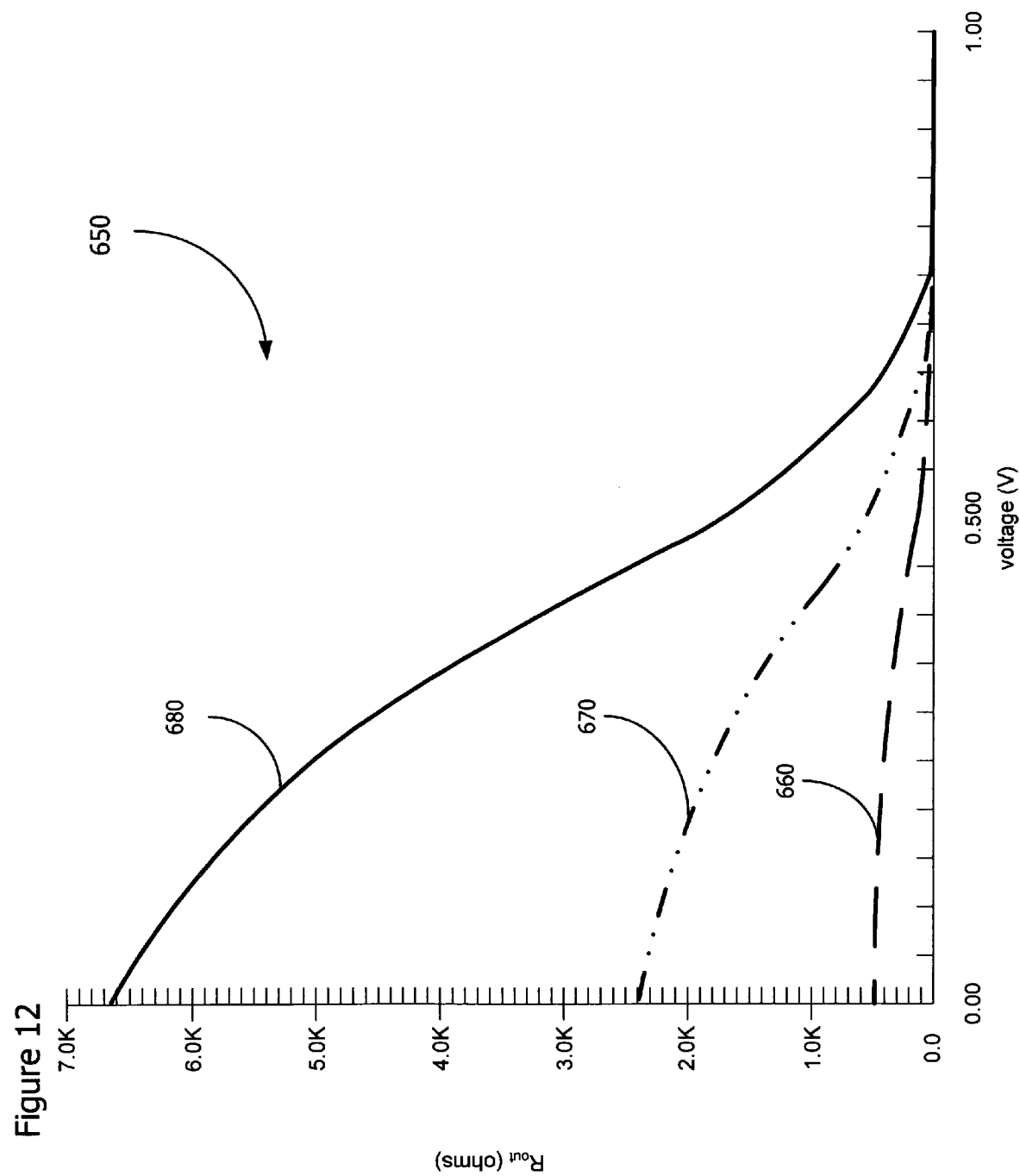
FIG. 12 is a graph of $R_{out}$ plots for the D/A converter of FIG. 10, with three different current generation topologies, according to some embodiments.

Comparisons between the D/A converter 500, implemented with a simple current mirror, a wide-swing cascode current mirror, and a wide-swing cascode current mirror with an active feedback loop, are illustrated in two graphs 600 and 650 of FIGS. 11 and 12, respectively. The graph 600 depicts an I-V curve for various current source implementations: a simple current mirror, a wide-swing cascode current mirror, and a wide-swing cascode current mirror with an active feedback loop (as implemented in the D/A converter 500). The graph 600 plots voltage (x-axis) against current (y-axis). A curve 610 (dashed) represents the design using the simple current mirror. A curve 620 (dotted dashed) represents the design using the wide-swing cascode current mirror. A curve 630 (solid) represents the design using the wide-swing cascode current mirror with an active feedback loop. The devices under test use PMOS transistors, thus, the current is given as negative values.

The plot 600 shows that, at very low voltages, say, under 500 mV, all three implementations produce about 20 mA of current at the current source. It is at the higher voltages that the three curves show a change. The current source for the simple current mirror implementation (curve 610) begins to drop at about 600 mV. Likewise, the current source for the wide-swing cascode current mirror implementation (curve 620) begins to drop at about 700 mV. The current source for the wide-swing cascode current mirror with the active feedback loop implementation (curve 630) maintains a 20 mA current until the voltage exceeds approximately 800 mV. Of the three implementations, the wide-swing cascode current mirror with the active feedback loop design provides substantially more voltage headroom than the other two implementations, in some embodiments. The transistors that make up transistor array 520 (FIG. 10) are thus more likely to behave as good and linear current sources during operation of the D/A converter 500 across a wide output voltage range.

In FIG. 12, the plot 650 depicts the $R_{out}$ plots for the same three drivers as in FIG. 11, according to some embodiments. The $R_{out}$ plots are obtained by taking the derivative of the I-V curves from FIG. 11. The graph 650 plots voltage (x-axis) against $R_{out}$ (y-axis). The $R_{out}$ plot 660 (dashed) is a derivative of the current mirror plot 610; the $R_{out}$ plot 670 (dotted dashed) is a derivative of the wide-swing cascode current mirror plot 620; the $R_{out}$ plot 680 (solid) is a derivative of the wide-swing cascode current mirror with the active feedback loop (implemented in the D/A converter 500) plot 630.

The plot 650 shows that when the voltage is under 500 mV, the $R_{out}$ plots for the three implementations are vastly different. The $R_{out}$ for the D/A converter 500 implementation (plot 680) ranges between 1800 Ohms and 7700 Ohms. In contrast, the simple current mirror (plot 660) has an $R_{out}$ of 500 Ohms or less while the wide-swing cascode current mirror (plot 670) has an $R_{out}$ that ranges between 600 Ohms and 2400 Ohms. Even as the voltage exceeds 500 mV, the D/A converter 500 has an $R_{out}$ that exceeds the simple current mirror implementation, and does not drop to zero until the voltage has exceeded 750 mV. Of the three implementations, the D/A converter 500 driver design provides substantially more output impedance ($R_{out}$) than the other two drivers, in some embodiments.

Returning to FIG. 7, the transmitter 400 includes both the transmit equalizer 100 (FIG. 4) that improves on the equalization of digital data with the two-tap MAC 50 (FIG. 3), as well as the improved D/A converter 400 with advanced biasing technique of the driver. The equalizer 100 is entirely decoupled from the D/A converter 400, allowing changes to be made in either sub-system without impacting the other. In some embodiments, the transmitter 400 may be used in high-speed communications, such as high-speed bus implementations for server systems.

While the invention has been described with respect to a limited number of embodiments, those skilled in the art will appreciate numerous modifications and variations therefrom. It is intended that the appended claims cover all such modifications and variations as fall within the true spirit and scope of the invention.

We claim:
1. A transmitter, comprising:
an equalizer to equalize a data signal being transmitted over a communications channel, the communications channel being a backplane, the equalizer comprising at least one finite impulse response filter, the finite impulse response filter comprising:
a digital output, the digital output being based on one or more bits of the data signal; and
a two-tap multiply-accumulate circuit comprising an accumulator, wherein the two-tap multiply-accumu- late circuit produces a sum based on two bits of the data signal and two coefficients, wherein the sum is a portion of the digital output; and a digital-to-analog converter comprising a plurality of driver units to generate an analog signal, wherein the analog signal is transmitted over the communications channel;

wherein the transmitter includes no hardwired connection between the digital output and the plurality of driver units.

2. The transmitter of claim 1, the digital-to-analog converter further comprising:

a transistor array network comprising a pair of transistors, the pair of transistors being arranged in a cascode, the transistor pair operating as a current source;

a second transistor array network comprising a transistor, the transistor receiving current from the current source and producing an output voltage when a bit of an incoming data signal is turned on; and a third transistor array network comprising a second transistor, the second transistor receiving current from the current source and producing a second output voltage when the bit is turned off.

3. A digital-to-analog converter comprising:

a transistor array network comprising a pair of transistors, the pair of transistors being arranged in a cascode, the transistor pair operating as a current source;

a second transistor array network comprising a transistor, the transistor receiving current from the current source and producing an output voltage when a bit of an incoming data signal is turned on; and a third transistor array network comprising a second transistor, the second transistor receiving current from the current source and producing a second output voltage when the bit is turned off.

4. The digital-to-analog converter of claim 3, the transistor array network further comprising:

a plurality of binary-weighted transistor pairs, the transistor pair being one of the plurality, wherein the nth bit of the data signal is sourced current from $2^n$ transistor pairs in the transistor array network.

5. The digital-to-analog converter of claim 4, the second transistor array network further comprising a plurality of binary-weighted transistors, the transistor being one of the plurality, wherein the nth bit of the data signal supplies a gate voltage to $2^n$ transistors in the second transistor array network.

6. The digital-to-analog converter of claim 5, the third transistor array network further comprising a second plurality of binary-weighted transistors, the second transistor being one of the plurality, wherein the nth bit of a complementary data signal supplies a gate voltage to $2^n$ transistors of the third transistor array network, the data signal and the complementary data signal being differential signals.

7. The digital-to-analog converter of claim 3, wherein the transistor pair is biased with voltages from a bias sub-block circuit.

8. The digital-to-analog converter of claim 7, the bias sub-block circuit further comprising:

a wide-swing cascode circuit; and an active feedback loop circuit;

wherein the bias sub-block circuit produces a first bias voltage and a second bias voltage to supply gate voltages to the transistor pair.

9. The digital-to-analog converter of claim 8, the wide-swing cascode circuit further comprising:

a third transistor, the third transistor having its source and gate tied together and its drain tied to ground;

a fourth transistor, the fourth transistor having its source and gate tied together, wherein the gate of the third transistor is tied to the gate of the fourth transistor; and a fifth transistor whose source is tied to a drain of the fourth transistor and its drain is tied to ground;

wherein the third transistor and the fourth transistor receive a predetermined current.

10. The digital-to-analog converter of claim 9, the active feedback loop circuit further comprising:

a sixth transistor, the sixth transistor having its source and gate tied together;

a seventh transistor, the seventh transistor having its drain tied to ground and having its gate tied to the gate of the sixth transistor; and an eighth transistor, the eighth transistor having its source tied to a drain of the sixth transistor and its drain tied to ground;

wherein the sixth transistor receives a current one-seventh the predetermined current and the seventh transistor receives a current four-sevenths the predetermined current.

11. The digital-to-analog converter of claim 10, wherein the fourth and fifth transistors has a predetermined length and a predetermined width and the third transistor has the predetermined length and one-fourth the predetermined width.

12. The digital-to-analog converter of claim 11, wherein the sixth, seventh, and eighth transistors have the predetermined length and one-seventh the predetermined width.

13. A multiply-accumulate circuit, comprising:

a first circuit to perform a logic operation between a data bit of a data signal and a first coefficient, the logic operation producing a first output;

a second circuit to perform a second logic operation between a second data bit of the data signal and a second coefficient, the second logic operation producing a second output;

an N-bit accumulator to add a first N-bit value to a second N-bit value to produce an adder sum; and a multiplexer, controlled by the first output and the second output, wherein the multiplexer sends the first N-bit value to the N-bit accumulator.

14. The multiply-accumulate circuit of claim 13, wherein the logic operation and the second logic operation are exclusive-or operations.

15. The multiply-accumulate circuit of claim 14, wherein the first N-bit value is either zero, the absolute value of the first coefficient, the absolute value of the second coefficient, or the absolute value of the first coefficient plus the absolute value of the second coefficient.

16. The multiply-accumulate circuit of claim 15, wherein the second N-bit value is either zero or a second adder sum of a second multiply-accumulate circuit.

17. The multiply-accumulate circuit of claim 13, further comprising a delay circuit, wherein the first N-bit value is stalled by the delay circuit so that the first N-bit value and the second N-bit value are simultaneously received by the N-bit accumulator.

18. An equalizer comprising:

a first multiply-accumulate circuit to receive a first bit and a second bit of a digital signal, wherein the first multiply-accumulate circuit performs logic operations between the first bit, the second bit, a first coefficient, and a second coefficient, to produce a first adder sum; and a second multiply-accumulate circuit to receive the first bit and a third bit, the third bit being time-delayed from the second bit, the first bit, the second bit, and the third bit being available to the equalizer in a single clock cycle, wherein the second multiply-accumulate circuit performs logic operations between the first bit, the third bit, the first coefficient, and the second coefficient, to produce a second adder sum;
wherein the first multiply-accumulate circuit and the second multiply-accumulate circuit are executed simultaneously.

19. The equalizer of claim 18, further comprising:
a multiplexer to combine the first adder sum and the second adder sum, wherein the combination produces a digital output signal.

20. A system, comprising:
a coefficient generator to produce a first coefficient, $a_0$, and a second coefficient, $a_{-1}$; and
a multiply-accumulate circuit to receive an input data stream comprising a plurality of data bits, the plurality of data bits comprising a first data bit, $x_0$, and a second data bit, $x_{-1}$, wherein the multiply-accumulate circuit executes the mathematical expression, $|a_0|(x_0 \text{ xor sign}(a_0)) + |a_{-1}|(x_{-1} \text{ xor sign}(a_{-1}))$ to produce an N-bit sum, where N is an integer.

21. The system of claim 20, further comprising:
an adder to combine the N-bit sum with an N-bit prior sum to produce an N-bit subsequent sum.

* * * * *